US011962296B2

(12) United States Patent
Shahmiri et al.

(10) Patent No.: US 11,962,296 B2
(45) Date of Patent: Apr. 16, 2024

(54) FLEXIBLE SENSING INTERFACE SYSTEMS AND METHODS

(71) Applicant: Georgia Tech Research Corporation, Atlanta, GA (US)

(72) Inventors: Seyedeh Fereshteh Shahmiri, Atlanta, GA (US); Chaoyu Chen, Atlanta, GA (US); Gregory D. Abowd, Atlanta, GA (US); Shivan Mittal, Atlanta, GA (US); Thad Eugene Starner, Atlanta, GA (US); Yi-Cheng Wang, Atlanta, GA (US); Zhong Lin Wang, Atlanta, GA (US); Dingtian Zhang, Atlanta, GA (US); Steven L. Zhang, Atlanta, GA (US); Anandghan Waghmare, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 523 days.

(21) Appl. No.: 17/269,547

(22) PCT Filed: Aug. 21, 2019

(86) PCT No.: PCT/US2019/047398
§ 371 (c)(1),
(2) Date: Feb. 19, 2021

(87) PCT Pub. No.: WO2020/041403
PCT Pub. Date: Feb. 27, 2020

(65) Prior Publication Data
US 2021/0320657 A1    Oct. 14, 2021

Related U.S. Application Data

(60) Provisional application No. 62/721,263, filed on Aug. 22, 2018.

(51) Int. Cl.
*H03K 17/96*     (2006.01)
*G06F 3/038*     (2013.01)
(Continued)

(52) U.S. Cl.
CPC .......... *H03K 17/962* (2013.01); *G06F 3/038* (2013.01); *A63F 13/214* (2014.09);
(Continued)

(58) Field of Classification Search
CPC ..... H03K 17/962; H03K 2217/960755; H03K 2217/960765; H03K 2217/96054;
(Continued)

(56) References Cited

U.S. PATENT DOCUMENTS 3,798,474 A    3/1974  Cassand et al.
5,013,959 A *  5/1991  Kogelschatz ......... H01J 65/046
                                                                    313/635
(Continued)

FOREIGN PATENT DOCUMENTS

EP         1547243          8/2011
WO      WO 9414480    *    7/1994  ............. A61L 11/00
(Continued)

OTHER PUBLICATIONS

Search Report and Written Opinion from Application No. PCT/US2019/047398 dated Jan. 2, 2020 (13 pages).

*Primary Examiner* — Tung S Lau
(74) *Attorney, Agent, or Firm* — Troutman Pepper Hamilton Sanders LLP; Ryan A. Schneider; Dustin B. Weeks

(57)    ABSTRACT

Disclosed herein is a flexible sensing interface, comprising: a sensor, comprising: a core; an inner electrode in the form of a conductive material in contact with the core; an inner dielectric material substantially encasing the inner electrode; an outer electrode in the form of a conductive material in
(Continued)

contact with the inner dielectric material and in electrical communication with the inner electrode; and an outer dielectric material substantially encasing the outer electrode; wherein the inner dielectric material and the outer dielectric material comprise an elastic material. Also disclosed herein are systems and methods for making and using the same.

30 Claims, 12 Drawing Sheets

(51) Int. Cl.
 *A63F 13/214* (2014.01)
 *G06F 3/16* (2006.01)
 *G06N 20/00* (2019.01)

(52) U.S. Cl.
 CPC ...... *A63F 2300/1068* (2013.01); *G06F 3/165* (2013.01); *G06N 20/00* (2019.01); *H03K 2217/960755* (2013.01)

(58) Field of Classification Search
 CPC .......... H03K 2217/96078; G06F 3/038; G06F 3/165; A63F 13/214; A63F 2300/1068; G06N 20/00; H01F 17/00
 See application file for complete search history.

(56) References Cited

U.S. PATENT DOCUMENTS

| | | | |
|---|---|---|---|
| 7,008,596 B1* | 3/2006 | Rump | C01B 13/11 422/186.04 |
| 2002/0020223 A1 | 2/2002 | Kume | |
| 2006/0117552 A1 | 6/2006 | Zhang et al. | |
| 2008/0138992 A1* | 6/2008 | DiVergilio | H01Q 21/061 156/345.48 |
| 2016/0070392 A1 | 3/2016 | Wang et al. | |
| 2016/0209278 A1 | 7/2016 | Hus et al. | |
| 2018/0013427 A1 | 1/2018 | Okada | |

FOREIGN PATENT DOCUMENTS

| | | |
|---|---|---|
| WO | 2018067613 | 4/2018 |
| WO | 2018127839 | 7/2018 |

* cited by examiner

FLEXIBLE SENSING INTERFACE SYSTEMS AND METHODS

CROSS REFERENCE TO RELATED APPLICATIONS

This application claims the benefit of U.S. Provisional Application Ser. No. 62/721,263, filed on Aug. 22, 2018, which is incorporated herein by reference in its entirety as if fully set forth below.

FIELD OF THE DISCLOSURE

The present disclosure relates generally to flexible sensing interface systems and methods. Particularly, embodiments of the present disclosure relate to self-powered sensing interface systems and methods.

BACKGROUND

Sensing interfaces are part of numerous interactions of life every day. Old and analog sensing interfaces, such as light switches, volume knobs, video game joysticks and the like are being replaced by touch screen (and other touch-based) sensing interfaces, as well as voice-based sensing interfaces. Over the last few decades, there have been numerous efforts to develop novel tangible interfaces with a variety of form factors and sensing modalities to keep up with growing demand. For example, many analog light switches or light dimmers have been replaced by advanced touch-based lighting controls. Such sensing interfaces have been contemplated as active textiles and deformable/stretchable reactive objects, though the new sensing interfaces have been met with little commercial success. Other sensing modalities attempted to be used with the new form factors include optical, resistive, capacitive, piezoresistive, piezoelectric, and the like. A major problem with these developments in sensing interfaces, however, is that the sensing interfaces require some form of external power. Most forms of external power require either bulky and cumbersome power sources or cables running to power sources, greatly reducing the use environments of the sensing interfaces. New sensing interfaces must still maintain the deformable/stretchable properties capable of sensing a range of expressive interactions, while also having the ability to be self-powered. The elimination of an external power source will greatly expand the design potential of sensing interfaces and expand the design space of industries such as consumer electronics, smart homes, internet-of-things devices, smart textiles, home appliances, video games, and the like.

What is needed, therefore, is a sensing interface that is reversibly deformable (or stretchable), capable of sensing a wide range of expressive interactions, and self-powered to eliminate the need for an external power source. Embodiments of the present disclosure address this need as well as other needs that will become apparent upon reading the description below in conjunction with the drawings.

BRIEF SUMMARY OF THE INVENTION

The present disclosure relates generally to flexible sensing interface systems and methods. Particularly, embodiments of the present disclosure relate to self-powered sensing interface systems and methods. An exemplary embodiment of the present disclosure can provide a flexible sensing interface, comprising: a sensor, comprising: a core; an inner electrode in the form of a conductive material in contact with the core; an inner dielectric material substantially encasing the inner electrode; an outer electrode in the form of a conductive material in contact with the inner dielectric material and in electrical communication with the inner electrode; and an outer dielectric material substantially encasing the outer electrode; wherein the inner dielectric material and the outer dielectric material comprise an elastic material.

In any of the embodiments disclosed herein, the core can be cylindrical, and the inner electrode can be wound circumferentially around the core.

In any of the embodiments disclosed herein, the inner dielectric material can cylindrically encase the inner electrode, and the outer electrode can be wound circumferentially around the inner dielectric material.

In any of the embodiments disclosed herein, the outer dielectric material can cylindrically encase the outer electrode.

In any of the embodiments disclosed herein, the inner electrode can comprise a transition metal-containing wire.

In any of the embodiments disclosed herein, the outer electrode can comprise a transition metal-containing coating.

In any of the embodiments disclosed herein, the core, the inner dielectric material, and the outer dielectric material can comprise a dielectric rubber.

In any of the embodiments disclosed herein, the dielectric rubber can comprise silicone rubber.

In any of the embodiments disclosed herein, the sensor can have a Young's modulus of 46.72 kPa or less.

In any of the embodiments disclosed herein, the sensing interface can further comprise: one or more processors; a data acquisition device in communication with the sensor; a memory in communication with the one or more processors and storing instructions that, when executed by the one or more processors, cause the sensing interface to: receive an input at the sensor; detect a charge distribution in the sensor generated by a triboelectric effect; and receive, at the data acquisition device, a signal produced by the charge distribution in the sensor.

In any of the embodiments disclosed herein, the memory can further store instructions that, when executed by the one or more processors, cause the sensing interface to: determine if the signal received by the data acquisition device has an energy greater than a predetermined threshold; and if the energy is greater than the predetermined threshold, designate the signal as an interaction; and process the interaction to obtain an input classification.

In any of the embodiments disclosed herein, the memory can further store one or more machine learning algorithms configured to process the interaction.

In any of the embodiments disclosed herein, the memory can further store instructions that, when executed by the one or more processors, cause the sensing interface to: label the signal and the input classification as an entry; store the entry with other received entries in a labeled data set using one or more storage devices in communication with the one or more processors and the data acquisition device; and train the one or more machine learning algorithms using the labeled data set.

In any of the embodiments disclosed herein, the triboelectric effect can be between the sensor and an external object.

In any of the embodiments disclosed herein, the triboelectric effect can be between the inner electrode and the outer electrode.

Another embodiment of the present disclosure can provide a method of making a sensor, comprising: forming a core structure comprising a dielectric material; winding an inner electrode around the core structure; coating the core structure and the inner electrode with an inner casing comprising the dielectric material; winding an outer electrode around the inner casing; and coating the outer electrode with an outer casing comprising the dielectric material.

In any of the embodiments disclosed herein, the method can further comprise: curing the core structure after the forming; curing the inner casing after the coating; and curing the outer casing after the coating.

In any of the embodiments disclosed herein, the core structure can be cylindrical, and the inner electrode can be wound circumferentially around the core structure.

In any of the embodiments disclosed herein, the inner casing can cylindrically encase the inner electrode, and the outer electrode can be wound circumferentially around the inner casing.

In any of the embodiments disclosed herein, the outer casing can cylindrically encase the outer electrode.

In any of the embodiments disclosed herein, the inner electrode can comprise a transition metal-containing wire.

In any of the embodiments disclosed herein, the outer electrode can comprise a transition metal-containing coating.

In any of the embodiments disclosed herein, the dielectric material can comprise a dielectric rubber.

In any of the embodiments disclosed herein, the dielectric rubber can comprise silicone rubber.

In any of the embodiments disclosed herein, the sensor can have a Young's modulus of 46.72 kPa or less.

Another embodiment of the present disclosure can provide a method of using a sensing interface, comprising: receiving an input at a sensor; detecting a charge distribution in the sensor generated by a triboelectric effect; receiving, at a data acquisition device, a signal produced by the charge distribution in the sensor; determining, using one or more processors, if the signal received by the data acquisition device has an energy greater than a predetermined threshold; and if the energy is greater than the predetermined threshold, designating the signal as an interaction; and processing the interaction to obtain an input classification.

In any of the embodiments disclosed herein, the method can further comprise: labelling the signal and the input classification as an entry; storing the entry with other received entries in a labeled data set using one or more storage devices in communication with the one or more processors and the data acquisition device; and training the one or more machine learning algorithms using the labeled data set.

In any of the embodiments disclosed herein, the triboelectric effect can be between the sensor and an external object.

In any of the embodiments disclosed herein, the triboelectric effect can be between the inner electrode and the outer electrode.

In any of the embodiments disclosed herein, the determining can comprise a sliding window analysis algorithm.

In any of the embodiments disclosed herein, the determining can further comprise determining if the signal received by the data acquisition device has a length greater than a predetermined threshold length.

In any of the embodiments disclosed herein, the method can further comprise continuing to receive and determine until a signal greater than the predetermined threshold is found if the energy is not greater than the predetermined threshold.

In any of the embodiments disclosed herein, the processing can comprise processing using one or more machine learning algorithms.

These and other aspects of the present disclosure are described in the Detailed Description of the Invention below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various devices, systems, and methods of the present invention.

BRIEF DESCRIPTION OF THE DRAWINGS

The accompanying drawings, which are incorporated in and constitute a part of this specification, illustrate multiple embodiments of the presently disclosed subject matter and serve to explain the principles of the presently disclosed subject matter. The drawings are not intended to limit the scope of the presently disclosed subject matter in any manner.

DETAILED DESCRIPTION

Figure 1:
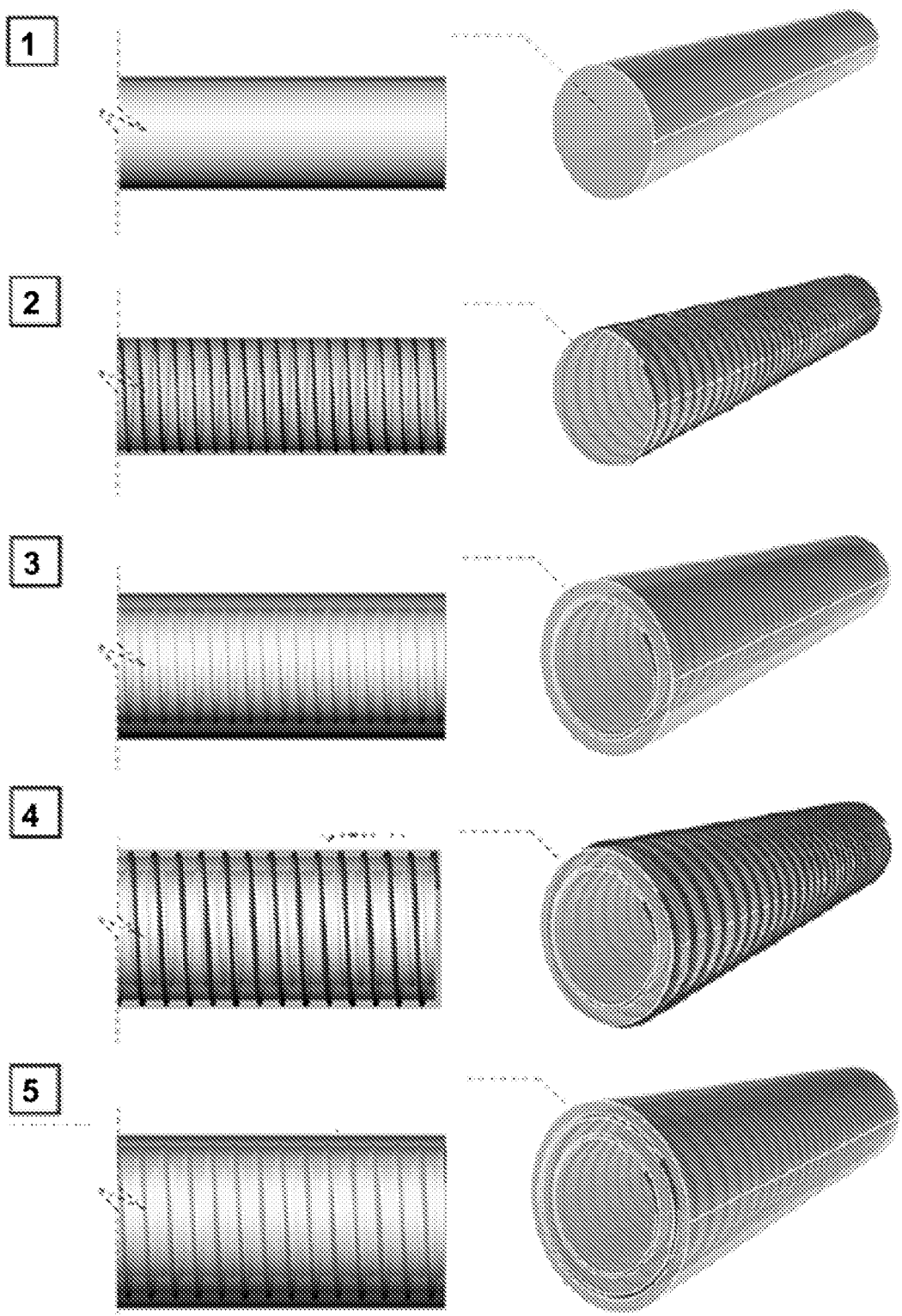
FIG. 1 is a perspective and cross-sectional rendering of multiple layers of a sensor according to some embodiments of the present disclosure.

Although certain embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. Other embodiments of the disclosure are capable of being practiced or carried out in various ways. Also, in describing the embodiments, specific terminology will be resorted to for the sake of clarity. It is intended that each term contemplates its broadest meaning as understood by those skilled in the art and includes all technical equivalents which operate in a similar manner to accomplish a similar purpose.

As described above, a major problem with conventional sensing interfaces is that they require some form of external power. This requires bulky and cumbersome power sources or cables running to power sources, greatly reducing the use environments of the sensing interfaces. Desirably, new sensing interfaces maintain the deformable/stretchable properties capable of sensing a range of expressive interactions, while also having the ability to be self-powered. The elimination of an external power source will greatly expand the design potential of sensing interfaces and expand the design space of industries such as consumer electronics, smart homes, internet-of-things devices, smart textiles, home appliances, video games, and the like. Therefore, a sensing interface that is reversibly deformable (or stretchable), capable of sensing a wide range of expressive interactions, and self-powered to eliminate the need for an external power source can remedy the shortcomings of current sensing technology.

In contrast to the past shortcomings of sensing interfaces, the present disclosure proposes improved systems and methods for processing inputs and signals to flexible, self-powered sensors. A sensor can be made from a dielectric material (in other words, an insulator) and multiple conductive electrodes (or a single electrode). A core can be created from the dielectric material, and an inner electrode can be placed around the core. The inner electrode and the core can be encased by another layer of the dielectric material, and an outer electrode can be placed around the encasing. An outer layer of the dielectric material can be used to encase the outer electrode and all of the subsequent layers. Such a sensor can be lightweight, flexible, and waterproof to be used in a wide variety of applications, such as clothing, consumer electronics, outdoor use, and the like.

The inner electrode and outer electrode can be placed in electrical communication such that electrons, or a current, can flow between the two electrodes. Such an arrangement of materials can give the sensor the ability to be a triboelectric nanogenerator. In other words, the sensor can retain a charge after coming into contact with another object that has a charge, such as human skin. In this manner, inputs can be made through human touch to induce a change in the charge of the sensor. The change in charge can correspond to an electric signal, and the electric signal can be analyzed to determine the type of input given to the sensor. For example, a tap on the sensor can cause a charge distribution between the inner and outer electrodes due to the triboelectric effect caused by charge on the human skin. The charge distribution can be received by a computer and analyzed to determine that the input was a tap. Once the input is determined, any number of actions can be performed in response to the tap. In this manner, the present disclosure can provide a sensing interface that is reversibly deformable (or stretchable), capable of sensing a wide range of expressive interactions, and self-powered to eliminate the need for an external power source.

Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" are intended to be open-ended and to reflect that structure, material, or acts are not necessary, the failure to use such terms is not intended to reflect that structure, material, or acts are essential. To the extent that structure, material, or acts are presently considered to be essential, they are identified as such.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified.

The components described hereinafter as making up various elements of the disclosure are intended to be illustrative and not restrictive. Many suitable components that would perform the same or similar functions as the components described herein are intended to be embraced within the scope of the disclosure. Such other components not described herein can include, but are not limited to, for example, similar components that are developed after development of the presently disclosed subject matter.

Embodiments of the present disclosure can provide a flexible sensing interface, comprising: a sensor, comprising: a core; an inner electrode in the form of a conductive material in contact with the core; an inner dielectric material substantially encasing the inner electrode; an outer electrode in the form of a conductive material in contact with the inner dielectric material and in electrical communication with the inner electrode; and an outer dielectric material substantially encasing the outer electrode; wherein the inner dielectric material and the outer dielectric material comprise an elastic material. Also disclosed herein are systems and methods for making and using the same.

Reference will now be made in detail to exemplary embodiments of the disclosed technology, examples of which are illustrated in the accompanying drawings and disclosed herein. Wherever convenient, the same reference numbers will be used throughout the drawings to refer to the same or like parts.

Figure 2A:
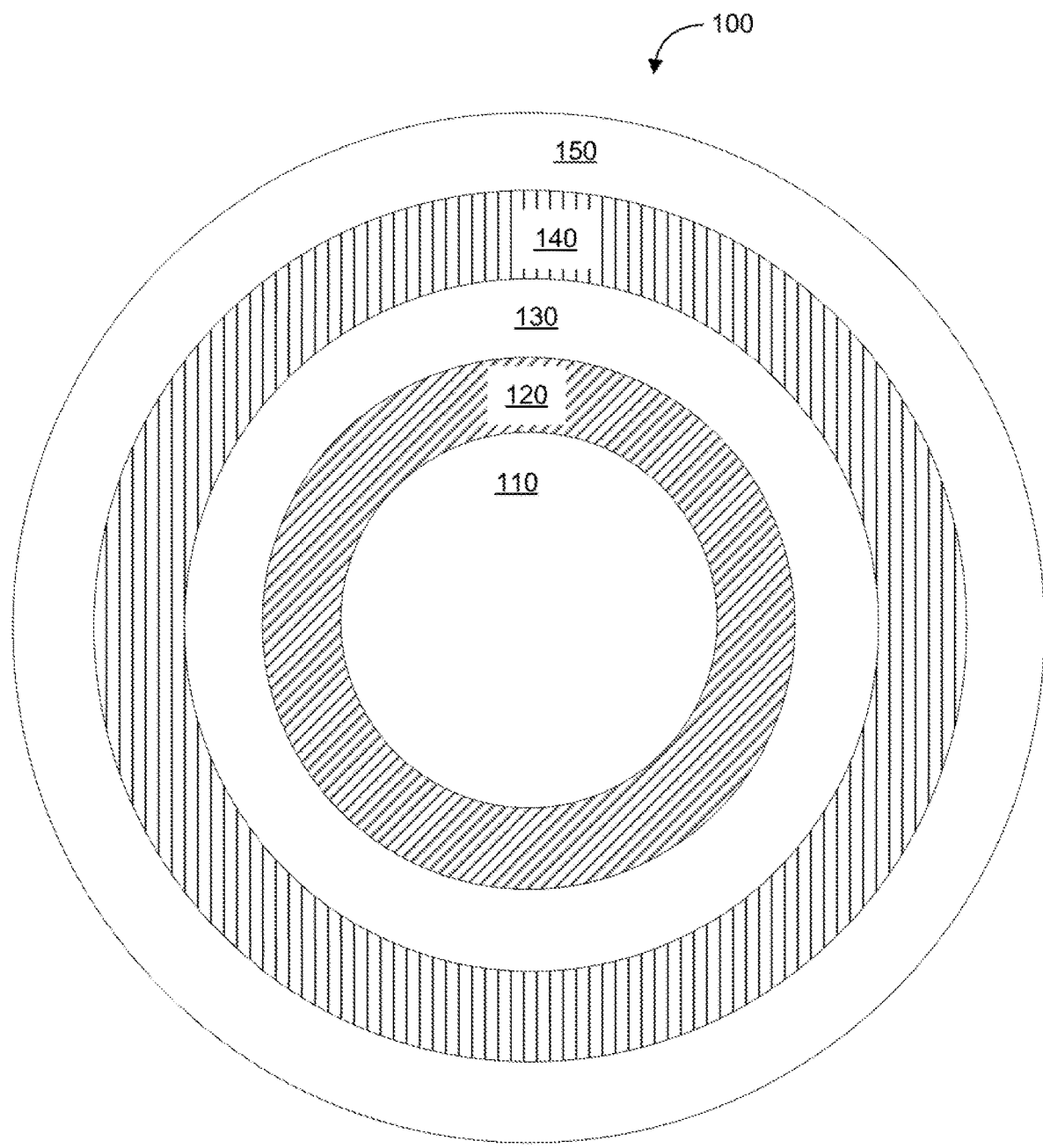
FIG. 2a is a cross-sectional view of a sensor according to some embodiments of the present disclosure.
Figure 2B:
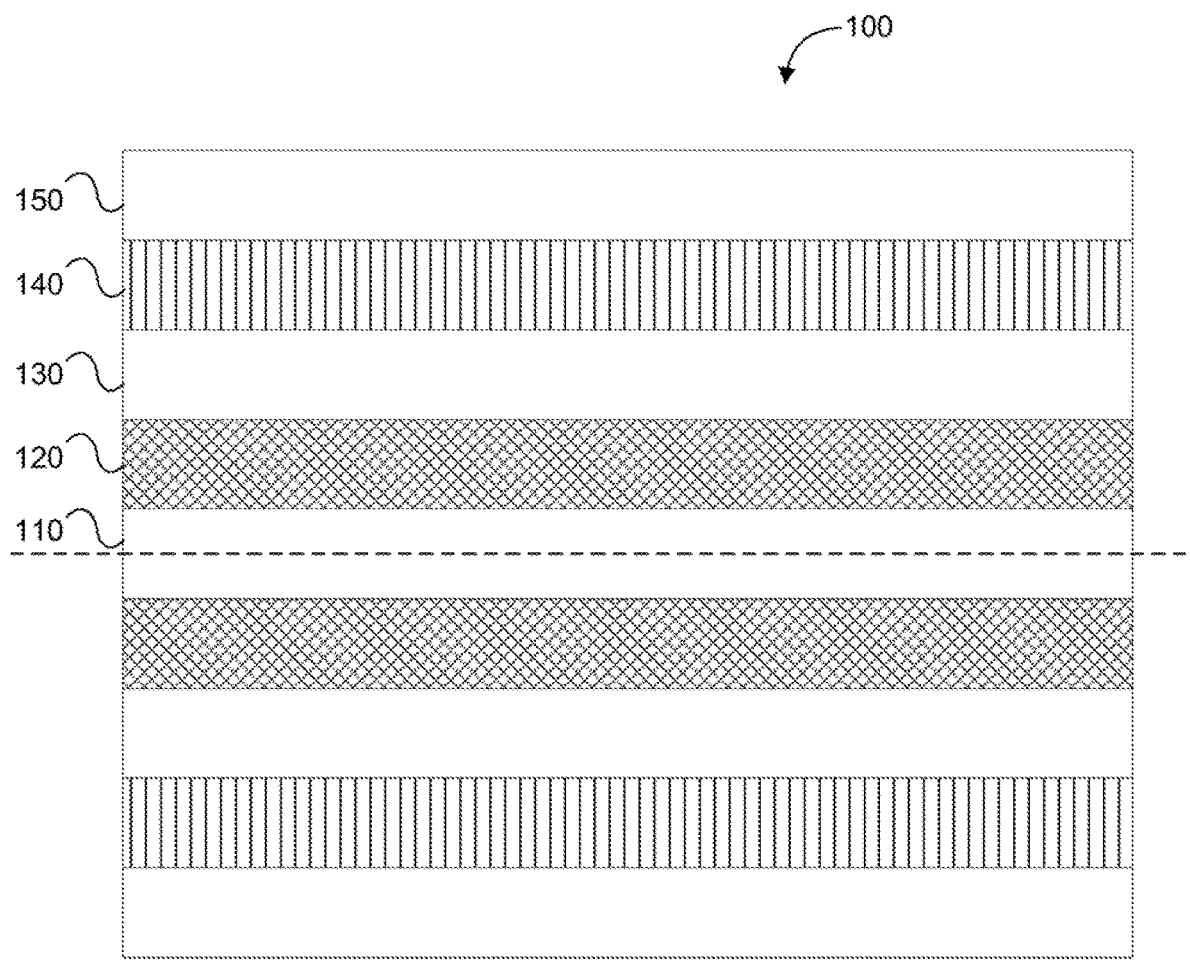
FIG. 2b is a cross-sectional view of a sensor according to some embodiments of the present disclosure.

FIG. 1 illustrates numerous layers of a sensor according to some embodiments of the present disclosure. FIG. 2*a* and FIG. 2*b* illustrate complete cross-sectional views of sensor 100 as pictured in FIG. 1. As shown, sensor 100 can comprise core 110, inner electrode 120, inner dielectric material 130, outer electrode 140, and outer dielectric material 150. In some embodiments, core 100, inner dielectric material 130, and outer dielectric material 150 can be made from substantially the same material. For example, core 100, inner dielectric material 130, and outer dielectric material 150 can comprise dielectric rubber, such as silicone rubber, silicones, acrylic elastomers, rubber-like materials, and the like. It is understood that, in other embodiments, core 100, inner dielectric material 130, and outer dielectric material 150 can be made from substantially different materials as long as the materials have dielectric properties. The dielectric materials can also be selected based on other material properties desired to be conferred to sensor 100, including, but not limited to, Young's modulus (elastic modulus), elasticity, Poisson's ratio, shear modulus, and the like.

In some embodiments, it may be desirable for sensor 100 to be highly elastic, for instance. In such an embodiment, the dielectric materials can be selected such that sensor 100 has a Young's modulus of 50 kPa or less (e.g., 49 kPa or less, 48 kPa or less, 47 kPa or less, 46 kPa or less, 45 kPa or less, 44 kPa or less, 43 kPa or less, 42 kPa or less, 41 kPa or less, 40 kPa or less, 35 kPa or less, 30 kPa or less, 25 kPa or less, 20 kPa or less, 15 kPa or less, 10 kPa or less, 9 kPa or less, 8 kPa or less, 7 kPa or less, 6 kPa or less, 5 kPa or less, 4 kPa or less, 3 kPa or less, 2 kPa or less, 1 kPa or less, 0.5 kPa or less, 0.1 kPa or less, or 0.01 kPa or less).

In some embodiments, the dielectric materials can be selected such that sensor 100 has a Young's modulus of 0.01 kPa or greater (e.g., 50 kPa or greater, 49 kPa or greater, 48 kPa or greater, 47 kPa or greater, 46 kPa or greater, 45 kPa or greater, 44 kPa or greater, 43 kPa or greater, 42 kPa or greater, 41 kPa or greater, 40 kPa or greater, 35 kPa or greater, 30 kPa or greater, 25 kPa or greater, 20 kPa or greater, 15 kPa or greater, 10 kPa or greater, 9 kPa or greater, 8 kPa or greater, 7 kPa or greater, 6 kPa or greater, 5 kPa or greater, 4 kPa or greater, 3 kPa or greater, 2 kPa or greater, 1 kPa or greater, 0.5 kPa or greater, or 0.1 kPa or greater).

Figure 4:
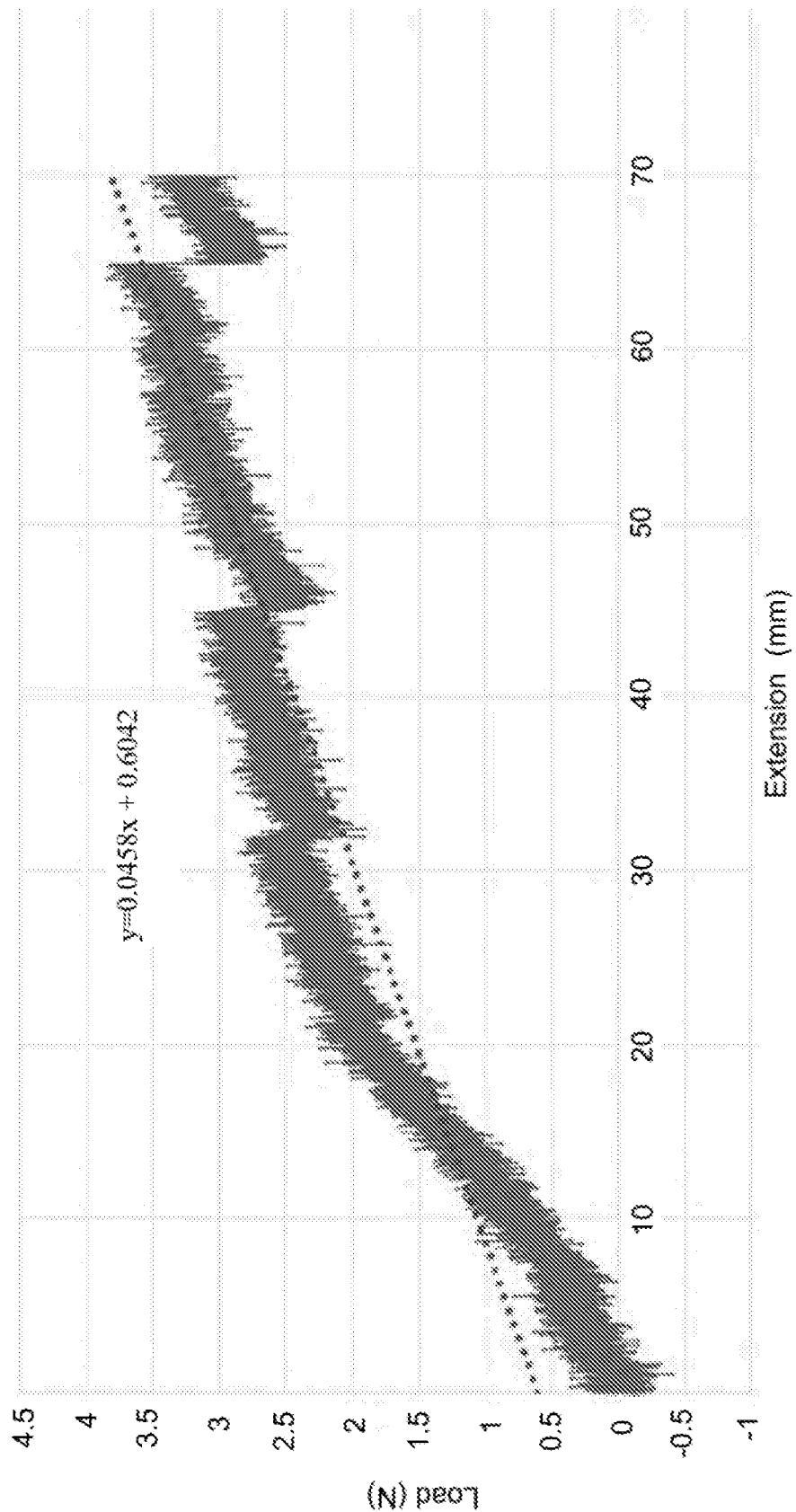
FIG. 4 is a plot of the Young's modulus for a sensor according to some embodiments of the present disclosure.
Figure 5:
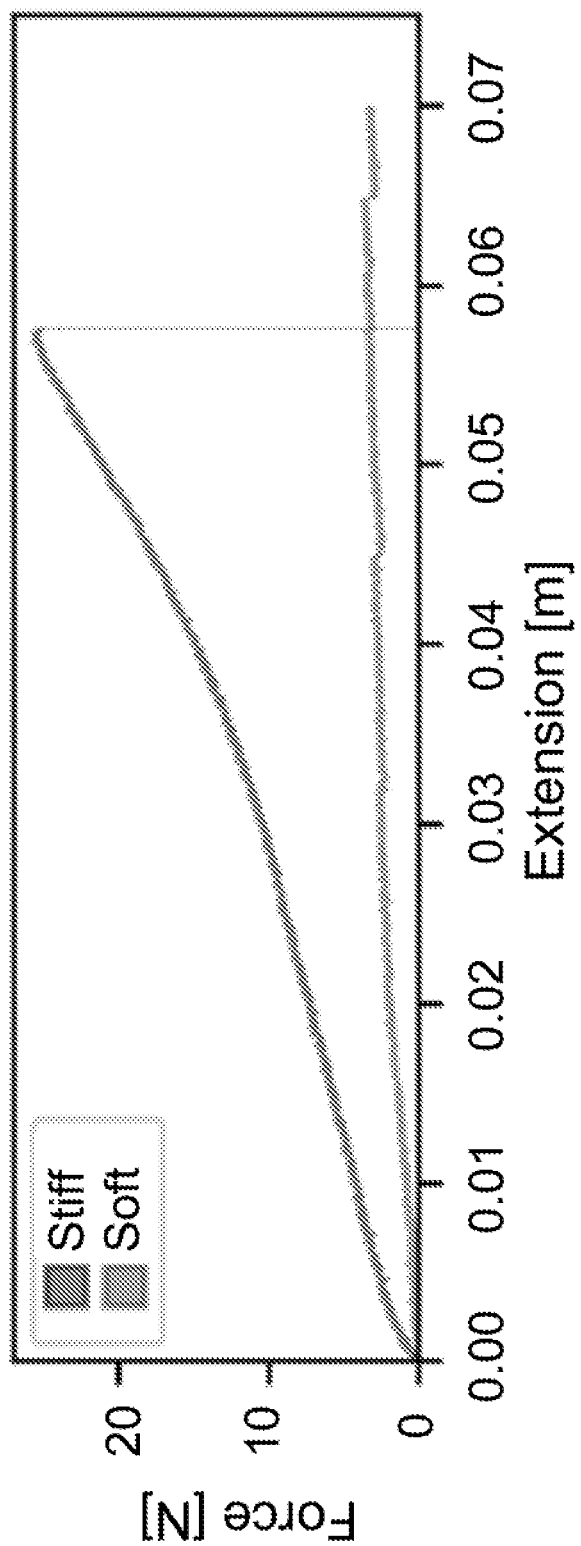
FIG. 5 is a plot of the Young's modulus for a sensor showing a stiff sensor and a soft sensor according to some embodiments of the present disclosure.

In some embodiments, the dielectric materials can be selected such that sensor 100 has a Young's modulus from 0.01 kPa to 50 kPa (e.g., from 0.1 kPa to 50 kPa, from 1 kPa to 50 kPa, from 1 kPa to 49 kPa, from 2 kPa to 48 kPa, from 3 kPa to 47 kPa, from 4 kPa to 46 kPa, from 5 kPa to 45 kPa, from 6 kPa to 44 kPa, from 7 kPa to 43 kPa, from 8 kPa to 42 kPa, from 9 kPa to 41 kPa, from 10 kPa to 40 kPa, from 15 kPa to 35 kPa, from 20 kPa to 30 kPa, from 40 kPa to 50 kPa, from 41 kPa to 50 kPa, from 42 kPa to 50 kPa, from 43 kPa to 50 kPa, from 44 kPa to 50 kPa, from 45 kPa to 50 kPa, from 46 kPa to 50 kPa, from 47 kPa to 50 kPa, from 48 kPa to 50 kPa, from 49 kPa to 50 kPa, from 0.01 kPa to 10 kPa, from 0.01 kPa to 9 kPa, from 0.01 kPa to 8 kPa, from 0.01 kPa to 7 kPa, from 0.01 kPa to 6 kPa, from 0.01 kPa to 5 kPa, from 0.01 kPa to 4 kPa, from 0.01 kPa to 3 kPa, from 0.01 kPa to 2 kPa, from 0.01 kPa to 1 kPa, or from 0.01 kPa to 0.1 kPa). A plot of the Young's modulus for an exemplary embodiment of sensor 100 can be found in FIG. 4 and FIG. 5. While FIG. 4 plots the Young's modulus of an exemplary flexible sensor 100, FIG. 5 plots the flexible sensor 100 compared to an exemplary stiff sensor 100.

Inner electrode 120 and outer electrode 140 can be made from conductive materials. A conductive material may be any material known to a person of ordinary skill in the art capable of maintaining a flow of electrons, or current. For example, inner electrode 120 and outer electrode 140 can comprise a transition metal as the conductive material. Other conductive materials can be used, such as ionic conductors, polymer-based conductors, metal-based conductors, and the like. The transition metal can be in the form of a transition metal-containing wire, coating, layer, plate, and the like. It is understood that inner electrode 120 and outer electrode 140 can be made from substantially different materials as long as the materials are conductive. The conductive materials can also be selected based on other material properties desired to be conferred to sensor 100, including, but not limited to, conductivity, resistivity, capacitance, tensile strength, tear strength, puncture resistance and the like. Additionally, inner electrode 120 and outer electrode 140 can be in electrical communication with each other such that electrons, or a current, can flow between inner electrode 120 and outer electrode 140. In some embodiments, inner electrode 120 and outer electrode 140 can further comprise insulating coatings or substrates. For example, inner electrode 120 can comprise a copper wire with a poly vinyl acetal coating, and outer electrode 140 can comprise a nylon thread with a silver plating.

In some embodiments, the conductive materials as used and described herein can have a resistivity of 170 Ω/m or less (e.g., 165 Ω/m or less, 160 Ω/m or less, 155 Ω/m or less, 150 n/m or less, 145 Ω/m or less, 140 Ω/m or less, 135 Ω/m or less, 130 Ω/m or less, 125 Ω/m or less, 120 Ω/m or less, 115 Ω/m or less, 110 Ω/m or less, 105 Ω/m or less, or 100 Ω/m or less). In some embodiments, the conductive materials can have a resistivity of 100 Ω/m or greater (e.g., 170 Ω/m or greater, 165 Ω/m or greater, 160 Ω/m or greater, 155 Ω/m or greater, 150 n/m or greater, 145 Ω/m or greater, 140 n/m or greater, 135 Ω/m or greater, 130 Ω/m or greater, 125 Ω/m or greater, 120 Ω/m or greater, 115 Ω/m or greater, 110 Ω/m or greater, or 105 Ω/m or greater). In some embodiments, the conductive materials can have a resistivity of from 100 Ω/m to 170 n/m (e.g., from 105 n/m to 165 Ω/m, from 110 Ω/m to 160 Ω/m, from 115 Ω/m to 155 Ω/m, or from 120 Ω/m to 150 Ω/m).

Inner electrode 120 and outer electrode 140 can be oriented in the sensor in order to generate a triboelectric effect. As shown in FIG. 2b, inner electrode 120 comprising a conductive material can be placed in contact with core 110. Inner dielectric material 130 can substantially encase inner electrode 120 and core 110, and outer electrode 140 comprising a conductive material can be placed in contact with inner dielectric material 130. Then, outer dielectric material 150 can substantially encase outer electrode 140, and therefore, core 110, inner electrode 120, inner dielectric material 130, and outer electrode 140. For instance, as shown in FIG. 2A, core 110 can be substantially cylindrical, and inner electrode 120 can be wound circumferentially around core 110. Additionally, inner dielectric material 130 can cylindrically encase inner electrode 120, and outer electrode 140 can be wound circumferentially around inner dielectric material 130. Finally, outer dielectric material can encase outer electrode 140 in a substantially cylindrical manner to create sensor 100.

Although some embodiments of the present disclosure are described having an inner electrode and an outer electrode, it is understood that a triboelectric effect can be generated in the sensor in a number of ways. As one of ordinary skill in the art would appreciate, for example, the sensor can comprise a core dielectric, a single electrode, and an outer dielectric to produce a triboelectric effect and interaction signals.

Figure 8:
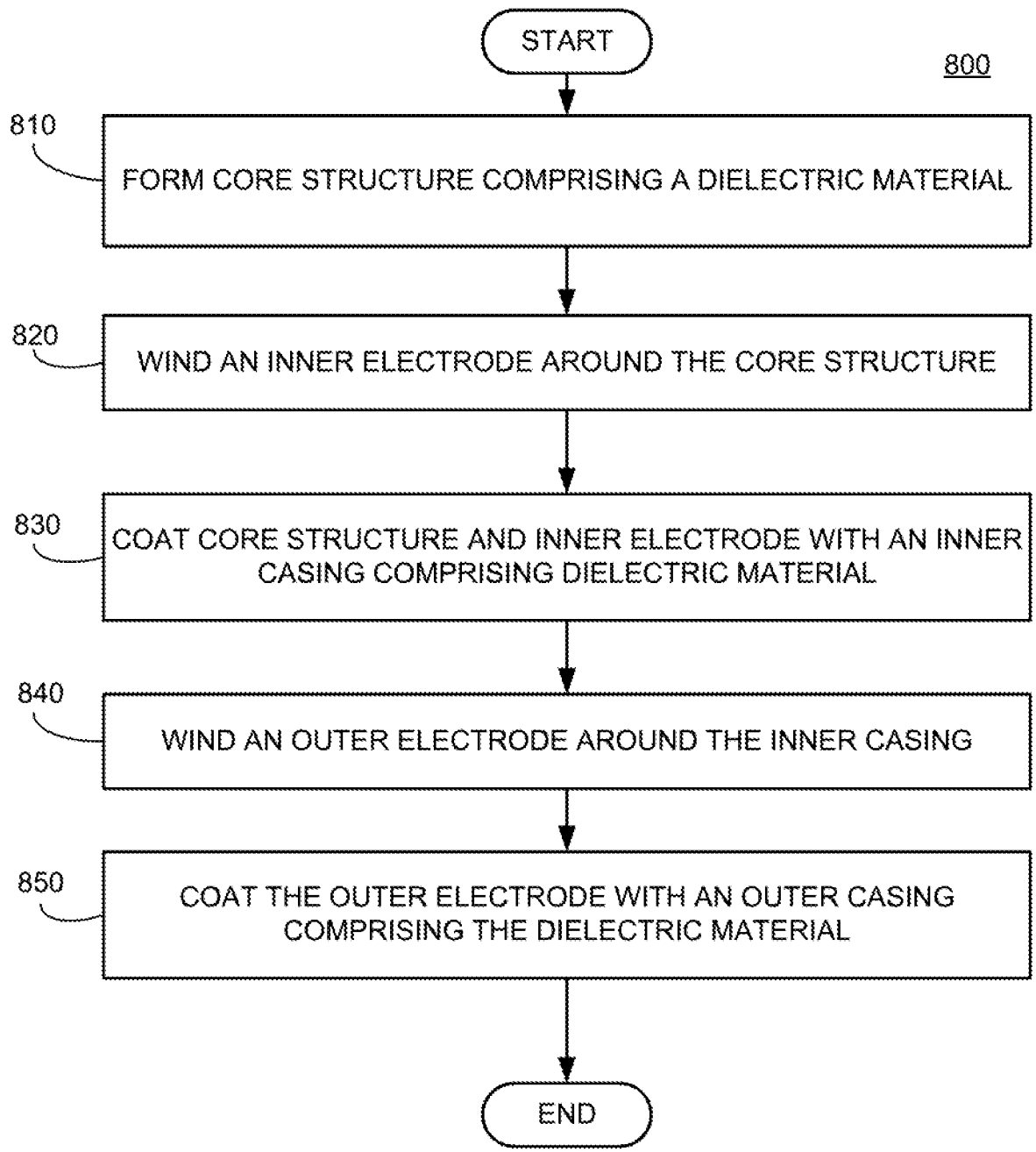
FIG. 8 illustrates a flowchart of a method of making a sensor according to some embodiments of the present disclosure.

FIG. 8 illustrates an exemplary method 800 of making sensor 100 according to some embodiments discussed above. As shown in block 810, a core structure can be formed comprising a dielectric material. The core structure can comprise a dielectric material as discussed above, and the core structure be cured after forming. For example, core 110 can be formed and cured in a substantially cylindrical shape. In some embodiments, the method then may proceed to block 820.

In block 820, an inner electrode can be wound around the core structure. The inner electrode can comprise materials as discussed above. For example, inner electrode 120 can be wound around cylindrical core 110. In some embodiments, the method then may proceed to block 830.

In block 830, the core structure and the inner electrode can be coated with an inner casing. The inner casing can comprise a dielectric material as is described above, and the inner casing can be cured after coating. For example, inner electrode 120 and core 110 can be coated by inner dielectric material 130 and substantially encased in a cylindrical manner. In some embodiments, the method can terminate after block 830, providing sensor 100 comprising core 110, inner electrode 120, and coated with an inner casing. In some embodiments, the method then may proceed to block 840.

In block 840, an outer electrode can be wound around the inner casing. The outer electrode can comprise materials as are described above. For example, outer electrode 140 can be wound around inner casing, in this case inner dielectric material 130. In some embodiments, the method then may proceed to block 850.

In block 850, the inner casing and the outer electrode can be coated with an outer casing. The outer casing can comprise a dielectric material as is described above, and the outer casing can be cured after coating. For example, outer electrode 140 and inner dielectric material 130 can be coated by outer dielectric material 150 and substantially encased in a cylindrical manner. In some embodiments, the method may terminate and complete after block 850. However, in other embodiments, the method may continue on to other method steps not shown. Such a method can provide for making sensor 100 according to some of the embodiments described above.

The arrangement of the layers in such embodiments facilitates the triboelectric effect in sensor 100 when in contact with external objects and can aid in producing a charge distribution in sensor 100 to generate an electrical signal to be processed.

Figure 3A:
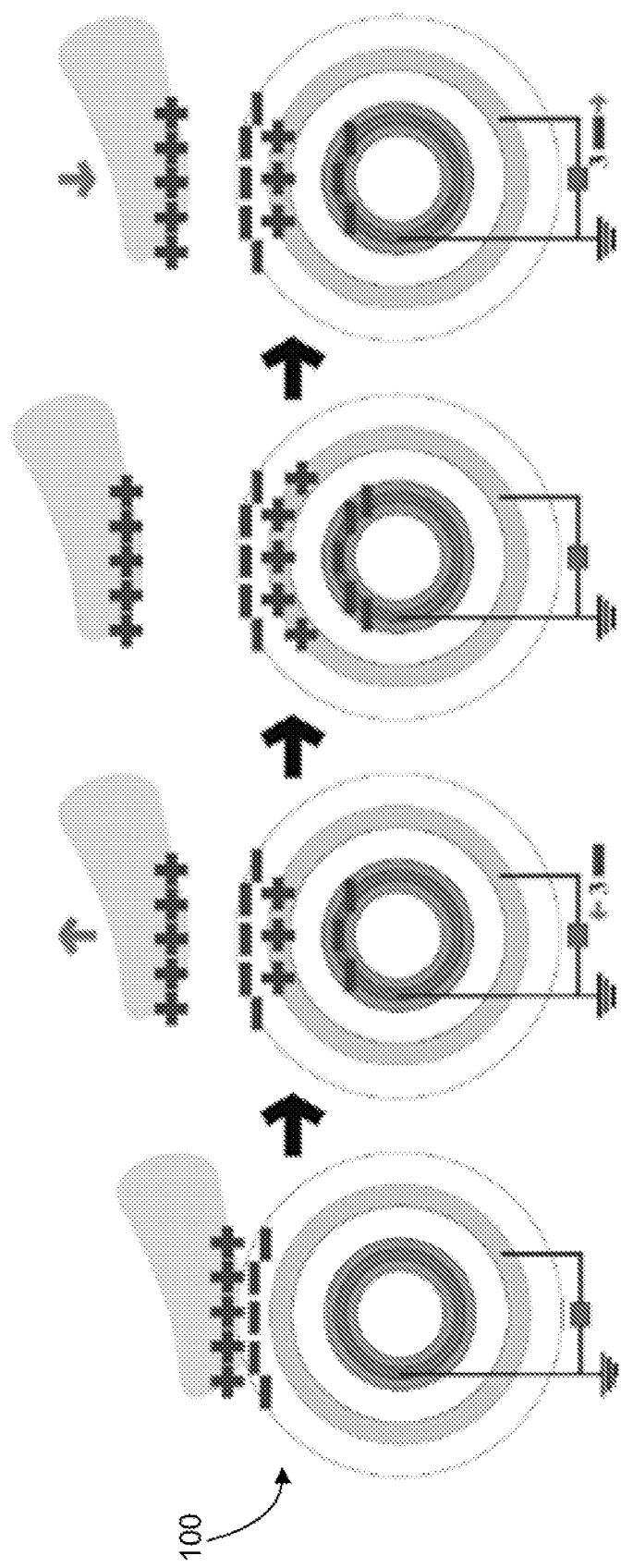
FIG. 3a is a cross-sectional view of a sensor undergoing a triboelectric effect according to some embodiments of the present disclosure.
Figure 3B:
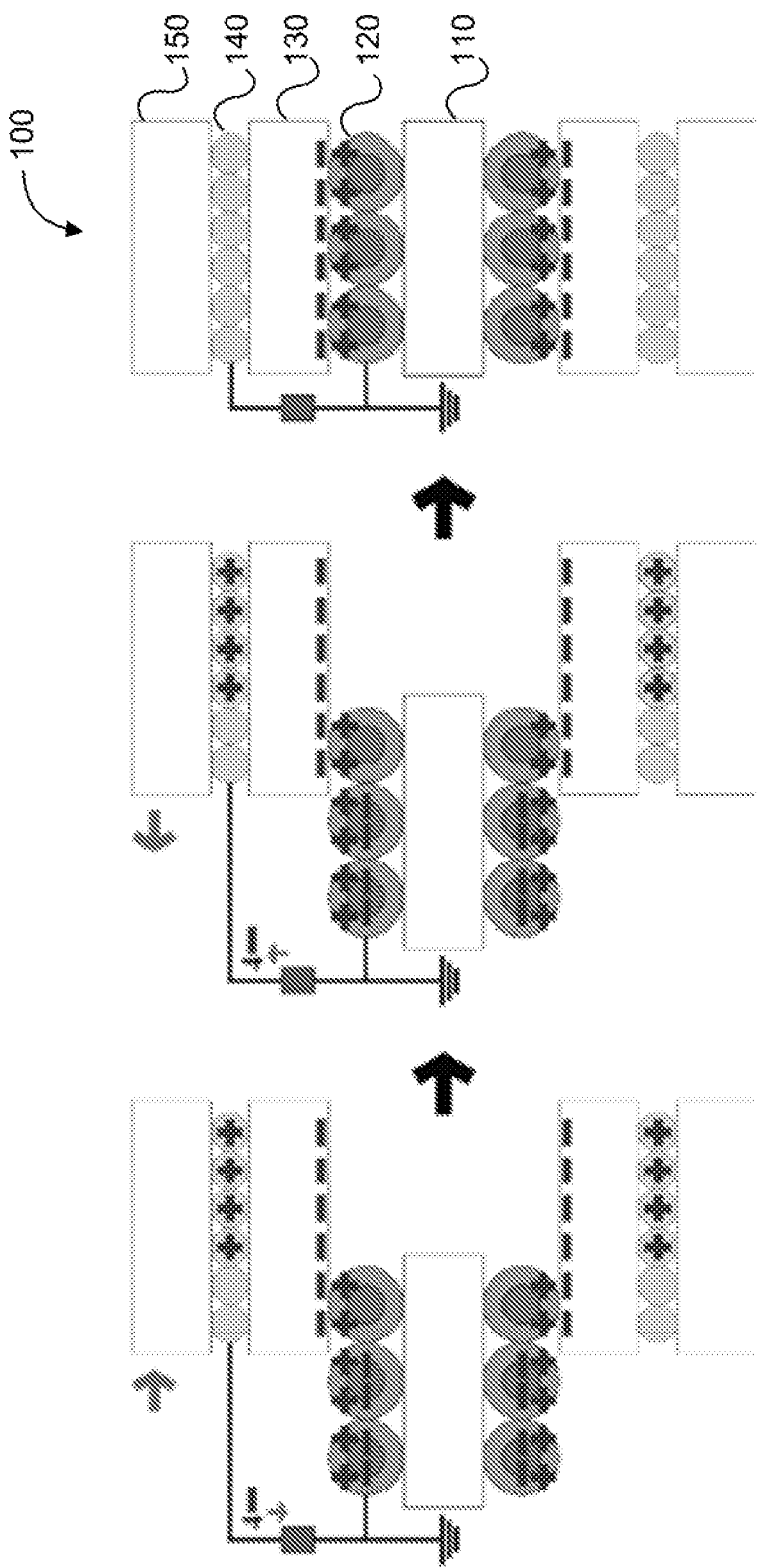
FIG. 3b is a cross-sectional view of a sensor undergoing a triboelectric effect according to some embodiments of the present disclosure.

The triboelectric effect in sensor 100 is illustrated with respect to the exemplary embodiments disclosed herein in FIG. 3a and FIG. 3b. As shown in FIG. 3a, the triboelectric effect can occur between sensor 100 and an external object, illustrated by a human finger. It is understood that other external objects can be used to induce the triboelectric effect in sensor 100. As shown, the positively-charged external object can contact outer dielectric material 150. As the external object moves away from sensor 100, an electric field is induced between the external object and sensor 100. The electric field induces outer dielectric material 150 to retain a negative charge and extends the electric field through sensor 100. Because outer electrode 140 is in electrical communication with inner electrode 120, electrostatic induction can occur as electrons flow from outer electrode 140 to inner electrode 120. This can result in another electric field to counterbalance the initial electric field caused by the external object. Should the external object return to sensor 100, the electric field can be reduced, so charge can flow in the opposite direction between the electrodes to maintain balance. In this manner, a charge distribution, and therefore a voltage, in sensor 100 can be created using the triboelectric effect.

As shown in FIG. 3b, the triboelectric effect alternatively can occur in sensor 100 while sensor 100 is under a longitudinal force along the cylindrical axis, such as stretching sensor 100. As shown, friction between inner dielectric material 130 and an insulation (i.e., a dielectric material) around inner electrode 120 can induce a charge distribution, making inner dielectric material 130 negatively charged and the insulation around inner electrode 120 positively charged to retain balance. Because outer electrode 140 is in electrical communication with inner electrode 120, the induced electric field can be balanced as current flows from inner electrode 120 to outer electrode 140. If sensor 100 is no longer under tension or being stretched, the current can reverse. Such a stretch-and-release process can cause a charge distribution in sensor 100 and, therefore, a voltage that can be processed as a signal. In these exemplary embodiments, the signals created by the charge distribution in sensor 100 can be sent to other components of the sensing interface to be processed.

Figure 6:
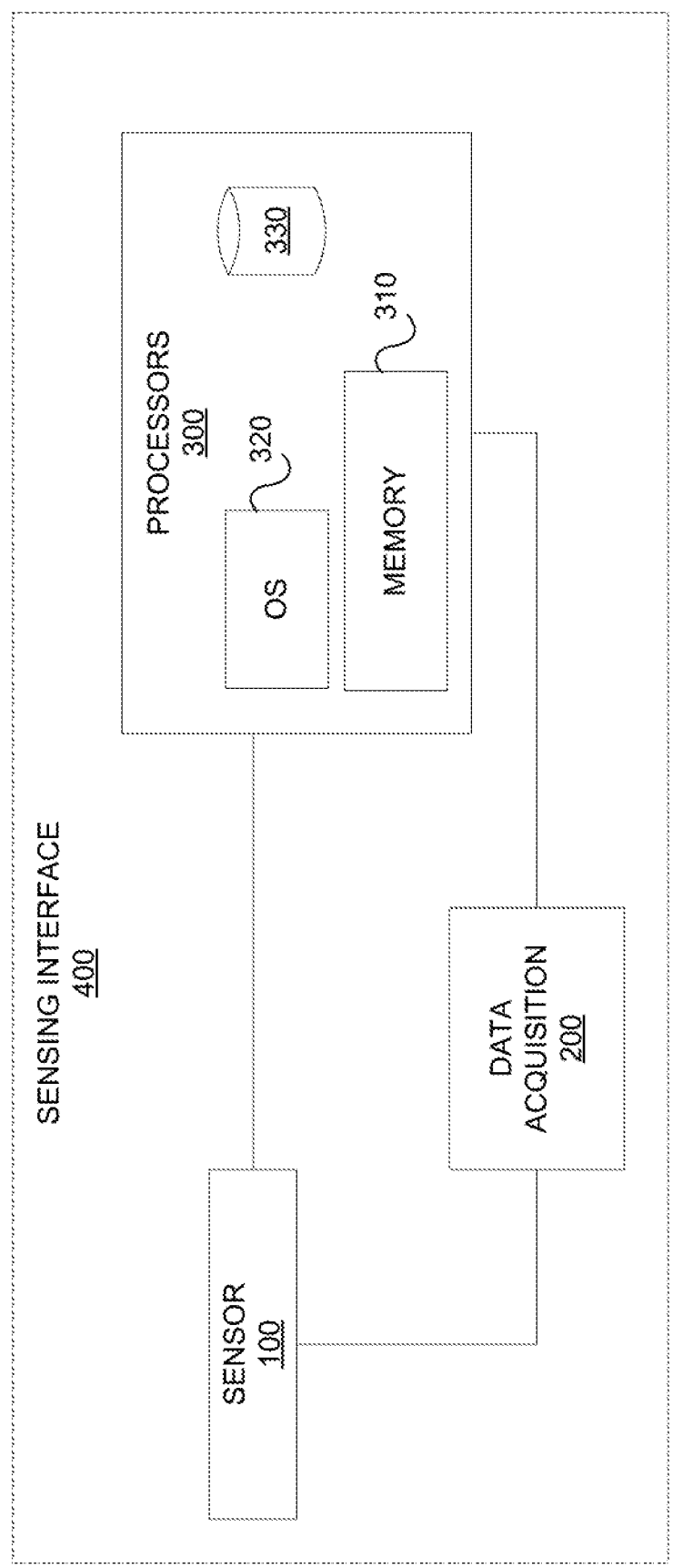
FIG. 6 illustrates an exemplary sensing interface system according to some embodiments of the present disclosure.

FIG. 6, for instance, illustrates an exemplary sensing interface 400 to process signals received from sensor 100. As shown, sensing interface can further comprise one or more processors 300, a data acquisition device 200 in communication with sensor 100 and processors 300, and memory 310 in communication with the one or more processors. The components described herein can further be in electrical communication with each other, as well as with other components of sensing interface 400. Sensing interface 400 can comprise one or more processors 300 in communication with memory 310. Memory 310 can store various instructions, programs, databases, machine learning algorithms, models, and the like, such as operating system (OS) 320. Memory 310 can communicate with processors 300 to, for instance, execute programs, store data, communicate with other components, and the like. Processors 300 can also provide external communication. For example, processors 300 can communicate over a network with various systems, such as a security system or a data logging system. Processors 300 can also be in communication with one or more storage devices, such as storage device 330, for storing data sets, documents, instructions, programs, and the like.

In some embodiments, processors 300 can communicate within sensing interface 400. Processors 300 can communicate with data acquisition device 200, for instance, to instruct data acquisition device 200 to begin logging and recording data from sensor 100. Processors 300 can further allow or facilitate communication of the other components of sensing interface 400. It is understood that other components of sensing interface 400 may be present but are not shown in FIG. 6. For example, sensing interface 400 can further comprise a user interface (UI) to display data, signals, programs, and the like. Any other components can be present in sensing interface 400 as desired by a person of ordinary skill in the art to improve the functioning of sensing interface 400.

In some embodiments, data acquisition device 200 can be any signal retrieval device known to a person of ordinary skill in the art. For example, data acquisition device 200 can comprise an oscilloscope. Data acquisition device 200 can be configured to monitor sensor 100 and transmit voltage data to processors 300. Thus, voltage data can always be gathered by sensing interface 400, and processors 300 can selectively analyze the voltage data to determine if an input signal was transmitted or not. Data acquisition device 200 can comprise additional signal or data gathering devices, including, but not limited to, voltmeters, ohmmeters, multimeters, frequency counters, RF probes, signal tracers, current transducers, capacitance meters, electrometers, and the like. In such embodiments, data acquisition device 200 and processors 300 can continuously gather, monitor, and process data from sensor 100 to determine signal inputs at sensor 100.

While the following methods are described with reference to sensing interface 400, it is understood that one or more method steps or whole methods can be performed by other systems, general-purpose computers, computer operators, and the like.

Figure 7:
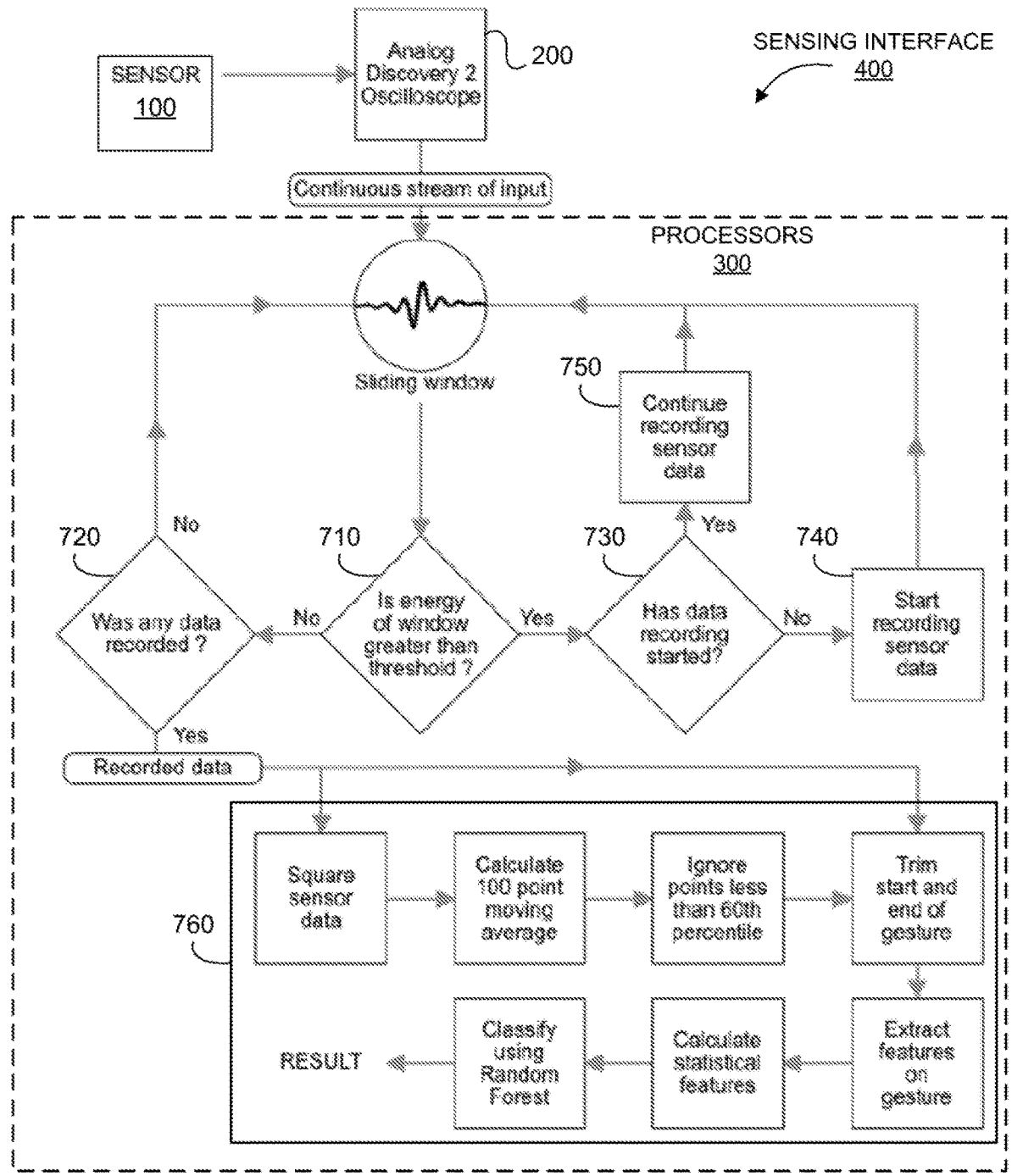
FIG. 7 illustrates a flowchart of a method of analyzing data from a sensor in a sensing interface according to some embodiments of the present disclosure.

FIG. 7 illustrates a flowchart of an exemplary system (e.g., sensing interface 400) and method executed by the system to gather and process signals with sensing interface 400. As shown, sensing interface 400 can comprise sensor 100, one or more processors 300, and a data acquisition device 200 in communication with sensor 100 and processors 300. Data, such as voltage data, can flow from sensor 100 to data acquisition device 200 and further on to processors 300 where it is recorded and processed. FIG. 7 illustrates an exemplary method of gathering and processing data executed by one or more processors 300 as the data is received from data acquisition device 200.

In block 710, the energy of the data can be measured to determine if the energy of the data is greater than a predetermined threshold. The predetermined threshold can be any suitable value to eliminate false positive input designations, reduce noise, and other similar criteria. For example, the predetermined threshold can be a minimum signal energy or a minimum signal length. In some embodiments, a sliding window data analysis technique can be used on the data to aid in making the determination. Other techniques can be deployed in tandem with or in replace of the sliding window, such as one or more machine learning algorithms. If the data is determined to be less than the predetermined threshold, the method may then proceed to block 720. However, in some embodiments, if the data is determined to be greater than the predetermined threshold, the method may then proceed to block 730.

In block 720, a determination can be made if any data has been recorded by the one or more processors 300. Processors 300 can check memory 310, storage devices 330, or other similar components of sensing interface 400 to determine if data has been recorded. If there has been no data recorded, the method can return to the beginning of the data analysis and block 710, as there is no recorded data to analyze. If, however, there has been data recorded, the method can then proceed to block 760 to begin the data analysis.

In block 730, a determination can be made if data recording has been initiated. Receiving data greater than the predetermined threshold may be indicative of an interaction at sensor 100, so therefore sensing interface 400 can start recording data so that the interaction can be processed. If it is determined that data recording has not started, the method may then proceed to block 740. However, in some embodiments, if it is determined that data recording has started, the method may proceed to block 750.

In block 750, processors 300 can instruct sensing interface 400 to continue recording the data. Data can be recorded and stored at, for example, memory 310, storage devices 330, or other similar components of sensing interface 400. The data can be stored in a manner such that it is easily accessible and able to be processed. The method can then return to block 710 to make another determination if the data is still above the predetermined threshold. If the data is not, then that can indicate that the interaction at sensor 100 has ended and only noise remains being recorded. If the data is greater than the predetermined threshold, then that can indicate that the interaction at sensor 100 is still ongoing, and recording can continue.

Block 760 illustrates an exemplary method for analyzing recorded data at processors 300. The exemplary method of block 760 is described in further detail in FIG. 10. In block 760, the recorded data can be analyzed to determine and classify the interaction based on the voltage data. Many techniques can be used to analyze the recorded data, such as one or more machine learning algorithms. The recorded data can be trimmed to isolate the signal and reduce noise, and the features of the signal can be made more pronounced to improve the analysis. Features in the signal used to classify the signal can include, but are not limited to, zero crossing rate, short-term energy, short-term entropy of energy, spectral centroid, spectral spread, spectral entropy, spectral flux, spectral rolloff, Hilbert wavelet transform, root mean square energy, spectral bandwidth, spectral flatness, and Haar wavelet. Other statistical features can be calculated and used to aid in classifying the signal, such as signal length, amplitude, duration, and the like. Once the signal has been classified and the result has been obtained, the method may terminate and complete after block 760. However, in other embodiments, the method may continue on to other method steps not shown. Such an embodiment is able to create a large data set of signal interactions with associated classifications. Thus, such a labeled data set encourages the use of machine learning techniques to improve performance.

In some embodiments, once the signal has been classified and the result has been obtained, a label can be applied to the original signal associating the original signal with the classification. The labeled signal can then be taken as an entry and stored with other labeled signals (entries) in a labeled data set. The labeled data set can be kept and stored at, for example, memory 310, storage devices 330, or other similar components of sensing interface 400. In this manner, the labeled data set can continue to grow as more signals and interactions are received and classified. In some embodiments, one or more machine learning algorithms can be trained using the labeled data set. In such an embodiment, the one or more machine learning algorithms can constantly improve and learn to ensure better accuracy and higher processing speed.

Figure 9:
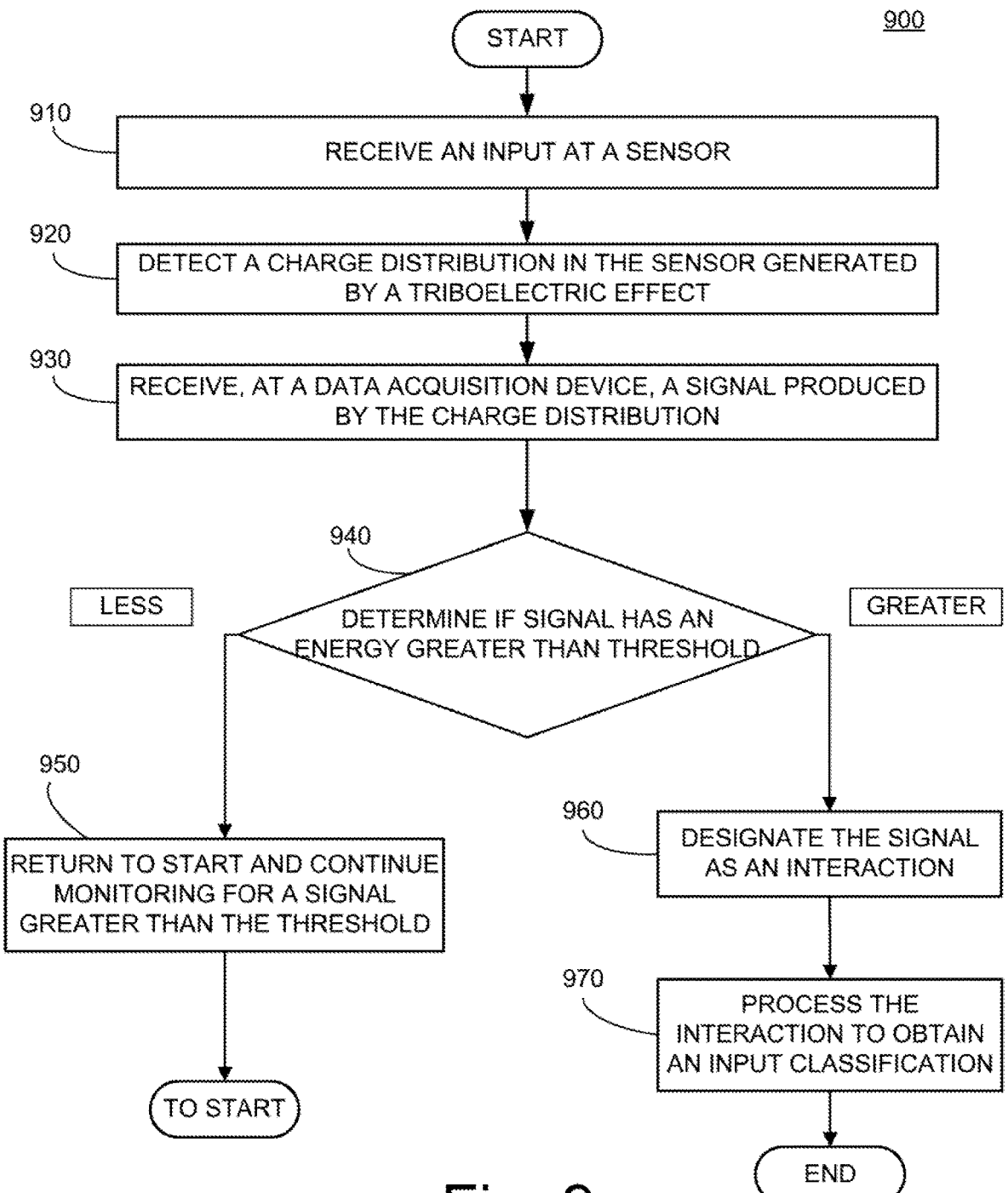
FIG. 9 illustrates a flowchart of a method of using a sensing interface according to some embodiments of the present disclosure.

FIG. 9 illustrates an exemplary method 900 of gathering and processing data executed by one or more processors 300 as the data is received from data acquisition device 200. Although FIG. 9 is described with reference to components of sensing interface 400, it is understood that method 900 can be executed by other systems. As shown, in block 910, an input can be received at sensor 100. An input can be an interaction with sensor 100 by a user. As sensor 100 is self-powered, sensor 100 can always be active and able to receive the input. In some embodiments, the method can then proceed to block 920.

In block 920, a charge distribution can be detected in sensor 100 generated by a triboelectric effect. The charge distribution can be detected, for example, as a voltage spike received by data acquisition device 200. The triboelectric effect, as discussed above, can occur within sensor 100 or between sensor 100 and an external object. In some embodiments, input, such as voltage data, from sensor 100 can be continuously received and logged. In some embodiments, the method can then proceed to block 930. In block 930, a signal caused by the charge distribution in sensor 100 can be received by data acquisition device 200. The signal can be, as discussed in block 920, a voltage spike or a length of time. The method can then proceed to block 940.

In block 940, the energy of the signal can be measured to determine if the energy of the signal is greater than a predetermined threshold. The predetermined threshold can be any suitable value to eliminate false positive input designations, reduce noise, and other similar criteria. For example, the predetermined threshold can be a minimum signal energy, a minimum signal length, or a minimum signal voltage. In some embodiments, a sliding window data analysis technique can be used on the signal to aid in making the determination. Other techniques can be deployed in tandem with or in replace of the sliding window, such as one or more machine learning algorithms. If the signal is determined to be less than the predetermined threshold, the method may then proceed to block 950. However, in some embodiments, if the signal is determined to be greater than the predetermined threshold, the method may then proceed to block 960.

In block 950, the method can return to block 910 to continue monitoring inputs from sensor 100 to find a signal greater than the predetermined threshold. The method can continue until a signal is determined to be greater than the predetermined threshold.

In block 960, the signal can be designated as an interaction. Therefore, processors 300 will know to further process the signal as an interaction. Other actions can be taken on the interaction before further processing, such as trimming the interaction length, reducing the interaction noise, and the like. In some embodiments, the method can then proceed to block 970.

In block 970, the interaction can be processed to determine a classification of the interaction. Many techniques can be used to process the interaction, such as one or more machine learning algorithms. The interaction can be trimmed to isolate the signal and reduce noise, and the features of the interaction can be made more pronounced to improve the analysis. Features in the interaction used to classify the interaction can include, but are not limited to, zero crossing rate, short-term energy, short-term entropy of energy, spectral centroid, spectral spread, spectral entropy, spectral flux, spectral rolloff, Hilbert wavelet transform, root mean square energy, spectral bandwidth, spectral flatness, and Haar wavelet. Other statistical features can be calculated and used to aid in classifying the interaction, such as signal length, amplitude, duration, and the like. Once the interaction has been classified and a result has been obtained, the method may terminate and complete after block 970. However, in other embodiments, the method may continue on to other method steps not shown. A more detailed description of an exemplary method used in block 970 is described below in FIG. 10.

Figure 10:
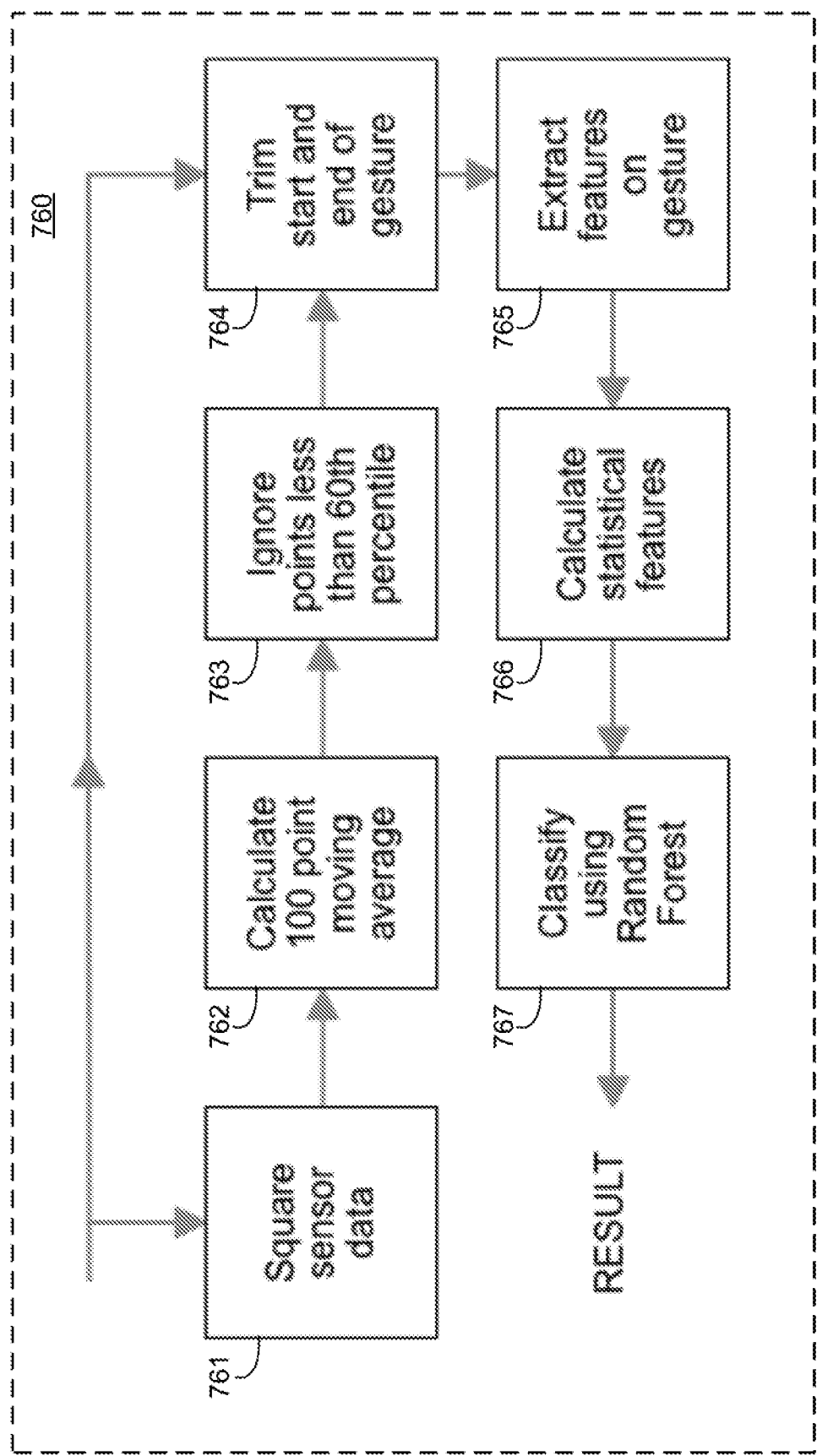
FIG. 10 illustrates a flowchart of a method of processing a signal according to some embodiments of the present disclosure.

FIG. 10 details an exemplary method for processing and classifying an interaction. As shown, in block 761, the data recorded from data acquisition device 200 can be squared to obtain the magnitude of the signal and reduce noise. A moving average can then be taken in block 762 with a window size of 100 points. Such averaging helps to fill portions of the signal where there exists an intermediate dip in energy, but the signal continues to grow after the dip. In block 763, all data points with an energy above a certain percentile can be taken for further analysis. The particular percentile can change based on desired criteria as one of ordinary skill in the art, but for example, data points can be taken with an energy of the $50^{th}$ percentile or greater (e.g., $55^{th}$ percentile or greater, $60^{th}$ percentile or greater, $65^{th}$ percentile or greater, $70^{th}$ percentile or greater, $75^{th}$ percentile or greater, $80^{th}$ percentile or greater, $85^{th}$ percentile or greater, $90^{th}$ percentile or greater, or $95^{th}$ percentile or greater). Data below the energy level of the certain percentile can then be ignored as non-signal data. In block 764, the signal can be trimmed to isolate the signal and reduce noise, and the features of the signal can be made more pronounced to improve the analysis in block 765. In block 766, other statistical features can be calculated and used to aid in classifying the signal, such as signal length, amplitude, duration, and the like. In block 767 then, the signal can be classified using a Random Forest classifier based on the features obtained in blocks 765 and 766. Once the signal has been classified and a result has been obtained, the method may terminate and complete after block 767. However, in other embodiments, the method may continue on to other method steps not shown.

As used in this application, the terms "component," "module," "system," "server," "processor," "memory," and the like are intended to include one or more computer-related units, such as but not limited to hardware, firmware, a combination of hardware and software, software, or software in execution. For example, a component may be, but is not limited to being, a process running on a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Certain embodiments and implementations of the disclosed technology are described above with reference to block and flow diagrams of systems and methods according to example embodiments or implementations of the disclosed technology. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, may be repeated, or may not necessarily need to be performed at all, according to some embodiments or implementations of the disclosed technology.

While the present disclosure has been described in connection with a plurality of exemplary aspects, as illustrated in the various figures and discussed above, it is understood that other similar aspects can be used, or modifications and additions can be made to the described aspects for performing the same function of the present disclosure without deviating therefrom. For example, in various aspects of the disclosure, methods and compositions were described according to aspects of the presently disclosed subject matter. However, other equivalent methods or composition to these described aspects are also contemplated by the teachings herein. Therefore, the present disclosure should not be limited to any single aspect, but rather construed in breadth and scope in accordance with the appended claims.

Exemplary Use Cases

The following exemplary use cases describe examples of a typical user flow pattern. They are intended solely for explanatory purposes and not limitation.

A sensor 100 can be deployed in a wide variety of user interface controllers for a video game, such as sliders, buttons, switches, and the like. For example, sensor 100 can be deployed in a slingshot controller for a video game. A user can pluck sensor 100 in the same manner they would pluck a physical slingshot. Upon receiving a pluck input from the user, a charge distribution can occur in sensor 100 due to a triboelectric effect. Voltage data from sensor 100 can be constantly recorded by data acquisition device 200, herein referred to as oscilloscope 300, and transmitted to one or more processors 300. The one or more processors 300 can be executing an analysis program to log and store the voltage data from oscilloscope 300 and determine if a valid signal was input to sensor 100. Upon recording the voltage signal caused by the charge distribution (due to the pluck input), processors 300 can determine that a signal was recorded and begin analysis of the signal. Processors 300 can classify the signal as a pluck and enact a corresponding action in the video game, such as launching a virtual projectile from a virtual slingshot. Processors 300 can also determine additional parameters based on the signal, such as the magnitude of the pluck or the angle of the pluck and enact corresponding actions in the video game.

A sensor 100 can be deployed as a switch for lamp in the style of typical lamp pull-chain. A user can pull, or stretch, sensor 100 vertically in the same manner they would pull on a physical lamp pull-chain. Upon receiving a pull input from the user, a charge distribution can occur in sensor 100 due to a triboelectric effect. Voltage data from sensor 100 can be constantly recorded by data acquisition device 200, herein referred to as oscilloscope 300, and transmitted to one or more processors 300. The one or more processors 300 can be executing an analysis program to log and store the voltage data from oscilloscope 300 and determine if a valid signal was input to sensor 100. Upon recording the voltage signal caused by the charge distribution (due to the pull input), processors 300 can determine that a signal was recorded and begin analysis of the signal. Processors 300 can classify the signal as a pull and enact a corresponding action on the attached lamp, such as turning the lamp on or off. Processors 300 can also determine additional actions based on different input signals, such as increasing or dimming the lamp in response to a twist input or changing the color of the lamp in response to a wiggle input.

A sensor 100 can be deployed as a string on an article of clothing (e.g., a hoodie, sweatshirt, jacket, sweatpants, shorts, etc.) and connected to a music playing device, such as headphones. A user can twist sensor 100 in the same manner they would twist a string (i.e., clockwise or counter-clockwise). Upon receiving a twist input from the user, a charge distribution can occur in sensor 100 due to a triboelectric effect. Voltage data from sensor 100 can be constantly recorded by data acquisition device 200, herein referred to as oscilloscope 300, and transmitted to one or more processors 300. The one or more processors 300 can be executing an analysis program to log and store the voltage data from oscilloscope 300 and determine if a valid signal was input to sensor 100. Upon recording the voltage signal caused by the charge distribution (due to the twist input), processors 300 can determine that a signal was recorded and begin analysis of the signal. Processors 300 can classify the signal as a twist and enact a corresponding action on the attached headphones, such as increasing or decreasing the volume. Processors 300 can also determine additional actions based on different input signals, such as skipping a song in response to a pluck input or pausing a song in response to a wiggle input.

In some embodiments, silicone rubber can be selected as the dielectric material for supporting and encapsulating the conductive layers. Silicone rubber (Ecoflex 00-50 Platinum Cure Silicone Rubber) and polydimethylsiloxane (PDMS) (Sylgard 184 Silicone Elastomer; Dow Corning) can be mixed. The silicone rubber can be mixed in a 1:1 (rubber:curing) weight ratio with a curing agent and stirred for 3 minutes. The PDMS can be mixed in a 10:1 (PDMS:curing) weight ratio with a curing agent and stirred for 5 minutes. Then, both materials can be mixed in a 4:1 (silicone:PDMS) weight ratio and stirred for 3 minutes. To fabricate the core 110 structure, the dielectric mixture can be poured into a 2.5 mm (inner diameter) cylindrical plastic tube and cured in an oven at 60° C. for 5 minutes (or at room temperature for 4 hours). The inner electrode 120 can comprise a commercial poly vinyl acetate (PVA)-enameled copper wire (0.17 mm diameter). Inner electrode 120 can then be wound in a tight spiral around core 110 with a density of winding of about 50 turns per cm of length of core 110. The entire assembly can then be coated with more of the silicone rubber mixture by, for example, laying the assembly flat and applying the silicone mixture over the entire surface using a syringe. This structure can be hung vertically for 5 minutes and then cured for 5 minutes in an oven at 60° C. to create inner casing 130. The outer electrode 140 can comprise commercial silver-plated nylon thread (0.18 mm diameter, <100 Ω/m resistance). Outer electrode 140 can then be wound around the whole assembly (i.e. the inner casing 130) with the same winding density as inner electrode 120. The outer casing 150 can then be applied in the same manner as inner casing 140 to obtain sensor 100 with a final thickness of about 4.5 mm.

What is claimed is:

1. A sensor comprising:
   a co-axial arrangement of layers about a central axis comprising, from an innermost layer to an outermost layer:
   a first, innermost core layer, having an outer core surface;
   a second, inner electrode layer, physically communicative with the outer core surface;
   a third, inner dielectric material layer, physically communicative with the inner electrode layer;
   a fourth, outer electrode layer, physically communicative with the inner dielectric material layer and electrically communicative with the inner electrode layer; and
   a fifth, outermost dielectric material layer, physically communicative with the outer electrode layer;
   wherein the sensor is reversibly deformable in response to a longitudinal force along the central axis.

2. The sensor of claim 1, wherein the outer electrode layer comprises a transition metal-containing coating.

3. The sensor of claim 1, wherein at least one of:
   the layers of the innermost core, the inner dielectric material, and the outermost dielectric material comprise a silicone rubber; or
   the sensor has a Young's modulus of 46.72 kPa or less.

4. The sensor of claim 1, wherein the sensor is self-powered; and
   wherein the sensor is further reversibly deformable in response to a lateral force normal the central axis.

5. A sensing interface comprising:
   the sensor of claim 1;
   one or more processors;
   a data acquisition device in communication with the sensor; and
   a memory in communication with one or more of the processors and storing instructions that, when executed by one or more of the processors, cause the sensing interface to:

receive an input at the sensor;
detect a charge distribution in the sensor generated by a triboelectric effect; and
receive, at the data acquisition device, a signal produced by the charge distribution in the sensor.

6. A sensing interface comprising:
the sensor of claim 1;
a processing platform comprising one or more processors;
a data acquisition device in communication with the sensor; and
a memory in communication with the processing platform and storing instructions that, when executed by the processing platform, cause the sensing interface to:
receive an input at the sensor;
detect a charge distribution in the sensor generated by a triboelectric effect;
receive, at the data acquisition device, a signal produced by the charge distribution in the sensor; and
determine if the signal received by the data acquisition device has an energy greater than a predetermined threshold.

7. A method of manufacturing the sensor of claim 1 comprising:
forming the innermost core layer from a core dielectric material;
curing the innermost core layer;
winding the inner electrode layer around the innermost core layer;
coating the innermost core layer and the inner electrode layer with an inner casing comprising the inner dielectric material layer;
curing the inner casing;
winding the outer electrode layer around the inner casing;
coating the outer electrode layer with an outer casing comprising the outer dielectric material layer; and
curing the outer casing.

8. A method comprising:
receiving an input at the sensor of claim 1;
detecting a charge distribution in the sensor generated by a triboelectric effect;
receiving, at a data acquisition device, a signal produced by the charge distribution in the sensor; and
determining, using one or more processors, if the signal received by the data acquisition device has an energy greater than a predetermined threshold.

9. The sensor of claim 2, wherein:
the innermost core layer is in a cylindrical form;
the inner electrode layer is a conductive material wound circumferentially around the outer core surface;
the inner dielectric material layer encases the inner electrode layer;
the outer electrode layer is a conductive material wound circumferentially around the inner dielectric material layer;
the outer dielectric material layer encases the outer electrode layer; and
the layers of the inner dielectric material and the outermost dielectric material comprise an elastic material.

10. The sensing interface of claim 5, wherein the memory further stores instructions that, when executed by one or more of the processors, cause the sensing interface to:
determine if the signal received by the data acquisition device has an energy greater than a predetermined threshold; and
if the energy is greater than the predetermined threshold:
designate the signal as an interaction; and
process the interaction to obtain an input classification.

11. The sensing interface of claim 5, wherein the triboelectric effect is between the sensor and an external object.

12. The sensing interface of claim 5, wherein the triboelectric effect is between the inner electrode and the outer electrode.

13. The sensing interface of claim 6, wherein the memory further stores instructions that, when executed by the processing platform, cause the sensing interface to:
designate each signal determined to have an energy greater than the predetermined threshold as an interaction;
store one or more machine learning algorithms configured to process the interaction to obtain an input classification;
label the interaction and the input classification as an entry;
store the entry with other received entries in a labeled data set using one or more storage devices in communication with the processing platform and the data acquisition device; and
train one or more of the machine learning algorithms using the labeled data set.

14. The method of claim 7, wherein the innermost core layer structure is cylindrical, and the inner electrode layer is wound circumferentially around the innermost core layer structure.

15. The method of claim 14, wherein the inner casing layer cylindrically encases the inner electrode layer, and the outer electrode layer is wound circumferentially around the inner casing.

16. The method of claim 7, wherein the inner electrode layer comprises a transition metal-containing wire.

17. The method of claim 7, wherein the outer electrode layer comprises a transition metal-containing coating.

18. The method of claim 7, wherein the dielectric material of at least one of the core dielectric material, the inner dielectric material layer, or the outer dielectric material layer comprises a dielectric rubber.

19. The method of claim 8 further comprising:
designating each signal determined to have an energy greater than the predetermined threshold as an interaction;
processing the interaction to obtain an input classification;
labelling the interaction and the input classification as an entry;
storing the entry with other received entries in a labeled data set using one or more storage devices in communication with one or more of the processors and the data acquisition device; and
training one or more machine learning algorithms using the labeled data set.

20. The method of claim 8, wherein the triboelectric effect is between the sensor and an external object.

21. The method of claim 8, wherein the triboelectric effect is between the inner electrode layer and the outer electrode layer.

22. The method of claim 8, wherein the determining comprises a sliding window analysis algorithm.

23. The method of claim 8, wherein the determining further comprises determining if the signal received by the data acquisition device has a length greater than a predetermined threshold length.

24. The method of claim 8 further comprising continuing to receive and determine until a signal greater than the predetermined threshold is found if the energy is not greater than the predetermined threshold.

25. The method of claim 8, wherein the processing comprises processing using one or more machine learning algorithms.

26. The sensor of claim 9, wherein the outermost dielectric material layer cylindrically encases the outer electrode layer.

27. The sensor of claim 9, wherein the inner electrode layer comprises a transition metal-containing wire.

28. The sensor of claim 9, wherein the layers of the innermost core, the inner dielectric material, and the outermost dielectric material comprise a dielectric rubber.

29. The method of claim 15, wherein the outer casing cylindrically encases the outer electrode layer.

30. The method of claim 18, wherein the dielectric rubber comprises silicone rubber.

* * * * *